United States Patent [19]

Ellbogen

[11] 3,792,365

[45] Feb. 12, 1974

[54] PUSH-PULL OUTPUT STAGE CIRCUIT

[75] Inventor: Erich Ellbogen, Langenbach Bayern, Germany

[73] Assignee: Texas Instruments Incorporated, Dallas, Tex.

[22] Filed: Jan. 18, 1972

[21] Appl. No.: 218,765

[30] Foreign Application Priority Data

Jan. 20, 1971 Germany .................. P 21 02 553.6

[52] U.S. Cl. ....................... 330/15, 330/13, 330/17, 330/18, 330/19

[51] Int. Cl. ........................... H03f 3/18, H03f 3/26

[58] Field of Search ............. 330/13, 15, 17, 19, 18

[56] References Cited

UNITED STATES PATENTS 2,761,917 9/1956 Aronson ............................ 330/15

3,537,023 10/1970 Myer ................................ 330/17 X

*Primary Examiner*—Roy Lake
*Assistant Examiner*—Lawrence J. Dahl
*Attorney, Agent, or Firm*—Harold Levine; Andrew M. Hassell; William E. Hiller

[57] ABSTRACT

Disclosed is an amplifier circuit including a pair of series-connected output transistors of one conductivity type, a pair of driver transistors of the one conductivity type and a pair of coupling transistors of opposite conductivity type; wherein the base electrodes of the output transistors are respectively coupled to the collector electrodes of the coupling transistors, and the base electrodes of the coupling transistors are respectively coupled to the collector electrodes of the lower transistors; thereby forming push-pull branches of the amplifier.

6 Claims, 2 Drawing Figures

PUSH-PULL OUTPUT STAGE CIRCUIT

Figure 1:
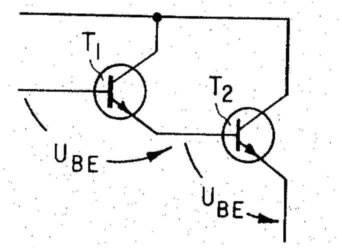

The invention relates to a push-pull output stage circuit for an amplifier comprising series-connected output transistors of the same conductivity type which are preceded in each push-pull branch by a driver transistor of the same conductivity type, and comprising a phase-inverter transistor of the complementary conductivity type preceding one push-pull branch.

Such output stage circuits comprising output transistors of the same conductivity type are used in particular when the circuit is to be integrated. For in the fabrication of integrated circuits in a substrate of certain basic doping it is possible to form only output stage transistors of one conductivity type which have a high current gain. Thus, for example, in an n-doped substrate it is possible to make npn transistors having a high current gain but only pnp transistors having a low current gain. Since for reasons of symmetry the output transistors of push-pull output stages are to have as far as possible equally high current gains, in integrated circuits it is desired to use output transistors of the same conductivity type.

To obtain a high current in the output stage without having to supply a high control current in the preceding stage the Darlington circuit is used in which the output transistor is directly preceded by a driver transistor. This driver transistor amplifies the small output current of the preceding stage and then controls the output transistor with the amplified current. In push-pull output stages such as Darlington circuit is present in each push-pull branch.

Although a high output current can be obtained with such an output stage circuit the available useful power is limited by voltage drops across the driver and output transistors. In addition to the inevitable voltage drops across preceding resistances and the input transistor of the output stage, emitter-base voltages across the output stage transistors in particular reduce the useful voltage swing and thus the available useful power.

This reduction in the useful voltage swing has a particularly disadvantageous effect when only a low supply voltage is available, such as with automobile radios, which are fed with a voltage of only 6 or 12 volts.

The problem underlying the invention is to provide a push-pull output stage circuit of the type referred to at the beginning which has a high useful power although fed with a low supply voltage.

According to the invention this problem is solved in that in each push-pull branch the emitter of the driver transistor is connected to the emitter of the output transistor and between the collector of the driver transistor and the base of the output transistor a complementary transistor is connected.

Doe to the insertion of the additional complementary transistor in the push-pull branches in the circuit according to the invention the base-emitter voltage drop occurs only once in each push-pull branch. The useful voltage swing is thereby increased and consequently a substantially higher useful power may be achieved.

Although in this circuit transistors of different conductivity type are used they may nevertheless easily be integrated because the transistors which must have a high current gain are of the same conductivity type. The complementary transistors inserted between the driver and the output transistors need not contribute to the current gain of the output stage.

Figure 2:
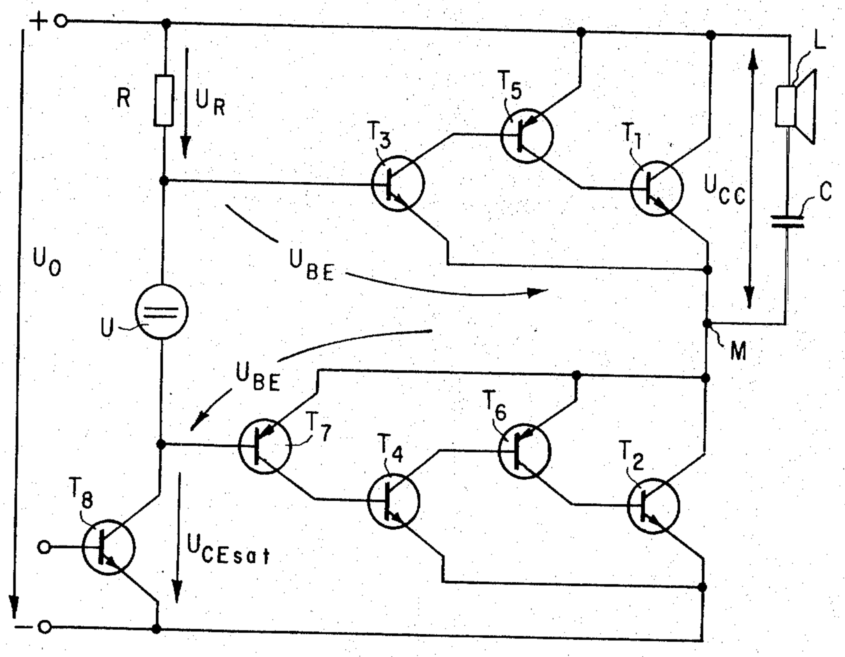

One example of embodiment of the invention is illustrated in the drawings, wherein:

FIG. 1 shows two transistors in a Darlington circuit as is conventionally employed in push-pull output stages, and FIG. 2 shows a circuit diagram of the output stage circuit according to the invention.

In the Darlington circuit illustrated in FIG. 1 the emitter of the driver transistor T 1 is connected to the base of the output transistor T 2. The two transistors are thus connected directly in series so that the output current of the driver transistor T 1 directly drives the output transistor T 2. This circuit is preferred in push-pull output stages because a high current gain can be obtained therewith. Such a Darlington circuit is then contained in each push-pull branch.

However, although this Darlington circuit is advantageous as regards the current gain a voltage drop $U_{BE}$ occurs across the base-emitter diode of each transistor. These voltage drops reduce the maximum available useful voltage swing and thus also the power of the output stage.

Since the available power increases with the square of the useful voltage swing it is desirable for the latter to approximate to the available supply voltage as far as possible. A circuit with which an improved approximation is obtained is shown in FIG. 2.

According to FIG. 2 the output stage circuit contains two output transistors T 1 and T 2 of the npn type which are connected together in series between the two terminals of the supply voltage. The collector of the output transistor T 1 is connected to the positive terminal and the emitter of the output transistor T 2 is connected to the negative terminal. The emitter of the transistor T 1 and the collector of the transistor T 2 are connected together at the circuit mid-point M. The two output transistors are each preceded by a driver transistor T 3 and T 4 respectively of the npn type whose emitters are each connected to the emitters of the associated output transistor. In each push-pull branch the collectors of the driver transistors T 3 and T 4 are connected via a pnp transistor T 5 and T 6 respectively to the output transistors T 1 and T 2. The pnp transistors T 5 and T 6 are included in the circuit in such a manner that their bases are connected to the collectors of the associated driver transistors and their collectors to the bases of the associated output transistors.

Preceding the driver transistor T 4 is a phase-inverter transistor T 7 of the pnp type which ensures the correct phase relationship between the signals supplied to the driver transistors T 3 and T 4. The emitter of said phase-inverter transistor T 7 is connected to the circuit mid-point M. The collector thereof is directly connected to the base of the driver transistor T 4.

The useful signal to be amplified in the output stage is supplied to the base of an npn transistor T 8 whose emitter is connected to the negative voltage terminal and whose collector is connected via a resistor R to the positive voltage terminal. The base of the driver transistor T 3 is connected via the collector resistor R of the transistor T 8 to the positive terminal of the supply voltage. Inserted between the resistor R and the collector of the transistor T 8 is a circuit arrangement U shown in simplified form in the drawing as a DC source. The bases of the transistors T 3 and T 7 are connected on both sides of the circuit arrangement U to the collector circuit of the transistor T 8 so that a constant voltage differential is maintained between the two base connections.

To take off the useful signal a loudspeaker L and a capacitor C connected in series therewith are inserted in the usual manner betwen the collector of the output transistor T 1 and the circuit mid-point M.

It can be seen from the circuit illustrated in FIG. 2 that the transistors which must have a high current gain, i.e., the transistors T 1, T 2, T 3, T 4 and T 8, are of the same conductivity type. They are npn transistors which may be formed with good electrical properties in an n-doped substrate if the circuit is to be integrated. Depending on their function in the circuit the complementary transistors T 5, T 6 and T 7 need have no current gain or only a small one. These complementary transistors may therefore easily be produced in the n-doped substrate.

It is apparent from the circuit described above that the emitter-base voltage drop $U_{BE}$ which reduces the useful voltage swing only occurs twice. The following useful voltage swing may therefore be obtained:

$$U_{SS} = U_o - 2U_{BE} - U_{CEsat} - U_R$$

This improvement in the useful voltage swing results in a considerable increase in the available output power because, as already mentioned, the available power increases as the square of the useful voltage swing. The reduction in the voltage drops $U_{BE}$ is particularly advantageous in output amplifiers of automobile radios where only a small supply voltage $U_o$ is available.

The output stage circuit could of course also be integrated in a p-doped substrate with equally good results; it is merely necessary to replace the transistors by complementary types and interchange the polarities of the voltages occurring.

What is claimed is:

1. An amplifier having a push-pull output stage circuit comprising:

a pair of series-connected output transistors of one conductivity type;

a pair of driver transistors of said one conductivity type respectively coupled to said series-connected output transistors;

a phase inverter transistor of opposite conductivity type coupled to only one of said driver transistors; and a pair of coupling transistors of said opposite conductivity type respectively coupling the output circuit of their respective driver transistor to the input circuit of their respective output transistor; and the respective driver transistors, coupling transistors, and output transistors respectively forming push-pull branches of said output stage circuit of said amplifier.

2. The amplifier of claim 1 wherein each of said driver transistors has its emitter electrode coupled to the emitter electrode of its respective output transistor, and each of said coupling transistors has its base electrode coupled to the collector electrode of its respective driver transistor, its collector electrode coupled to the base electrode of its respective output transistor, and its emitter electrode coupled to the collector electrode of its respective output transistor.

3. The amplifier of claim 1 and further including signal reproducing means coupled across the emitter-collector circuit of one of said push-pull branches.

4. The amplifier of claim 1 wherein said transistors are integrated on a common substrate.

5. The amplifier of claim 2, further including an input transistor of said one conductivity type and having its base electrode adapted to receive the signal to be amplified, negative and positive voltage terminals for connection to a supply voltage, the emitter and collector electrodes of said input transistor being respectively connected across the negative and positive voltage terminals, and the collector electrode of said input transistor being coupled to the base electrode of said phase inverter transistor.

6. The amplifier of claim 5, further including voltage differential means coupled to the collector electrode of said input transistor and the positive voltage terminal for maintaining a constant voltage differential between the base electrode of the respective driver transistor of one of said push-pull branches and the base electrode of said phase inverter transistor coupled to said driver transistor of the other push-pull branch.

* * * * *